*INVENTOR,*
PATRICK E. MULVIHILL
*BY* Jack H Linscott
ATTORNEY.

3,015,012

INDUCTION HEATING ARRANGEMENT FOR SEALING SEMICONDUCTOR ELECTRICAL DEVICE IN GLASS HOLDER

Patrick E. Mulvihill, Fairhaven, N.J., assignor to the United States of America as represented by the Secretary of the Army Filed May 2, 1960, Ser. No. 26,387
2 Claims. (Cl. 219—10.53)
(Granted under Title 35, U.S. Code (1952), sec. 266)

Figure 1:
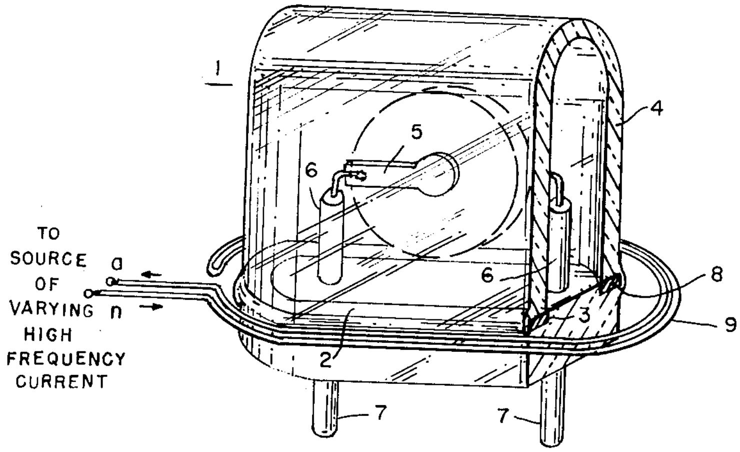

The invention described herein may be manufactured and used by or for the Government for governmental purposes, without the payment of any royalty thereon.

The invention relates to the manufacture of assembled electrical apparatus and particularly to the sealing of mounted solid state electrical devices, such as semiconductor units like crystal diodes, transistors, quartz crystals, etc., to be used for tuning or other electrical purposes, in glass holders.

One of the physical laws of electricity and magnetism is that a metallic conductor carrying an electric current has a magnetic field surrounding it which varies in magnitude and direction correspondingly with changes in the magnitude and direction of the electric current. A second physical law is that a second conductor placed within the changing magnetic field of the first conductor will have a voltage induced in it which, if the second conductor forms a closed electrical path, will cause the latter to be heated to a higher temperature. Other effects may give rise to higher temperatures in the second conductor, but their description herein is not essential or necessary for an adequate understanding of induction heating (IH) as used in the present invention, which is primarily based on the aforementioned phenomena.

Induction heating has many applications in industry, such as spot annealing, soldering, hardening and brazing operations, and the sealing of mechanical and electrical equipment within suitable holders. One important application of induction heating is the sealing of semiconductor diode or transistor devices or assemblies thereof within glass holders, because it provides a convenient source of rapid heating, capable of close temperature control and which may be concentrated in certain restricted areas. One known arrangement of this type used for soldering metal electric leads to a Kovar sleeve in a glass capsule for sealing a semiconductor diode assembly within the capsule employs a conical concentrator type of induction coil supplied from a high frequency source to provide concentrated heating to a solder ring and adjacent parts of the sleeve at the base of the cone while minimizing the transfer of heat to and thereby prevent melting of an alloy joint between the leads and the semiconductor elements in an adjacent area and thus prevent damage to these elements caused by the heating operation.

A broad object of the invention is to provide a new arrangement for applying induction heating to the sealing of solid state electrical devices in a glass holder in a very efficient manner while minimizing adverse effects of the heating on these devices and their associated mountings in the holder.

A more specific object is to provide a method of utilizing induction heating to provide a hermetic seal of the two glass parts of a holder or envelope in which the semiconductor crystal devices are mounted, without adverse effects on the electrical characteristics of those devices due to the heating of the metal supports for mounting the devices within the holder.

One embodiment of the invention for obtaining the above objectives includes a closed metallic strip in a shape determined by the contour of the hollow glass holder imbedded in an adjoining surface around the perimeter of one of two parts of the holder to be joined to enclose a quartz crystal or semiconductor device mounted within the holder by metal supports having electrical leads extending through the glass walls of the holder to the exterior thereof to connect the semiconductor devices to an associated electrical circuit. An electrical coil having a few turns supplied with varying high frequency current from an associated source surrounds the holder in close proximity to the metal strip. The current flow in the closed metal strip induced by the surrounding magnetic field of the coil in response to the applied high frequency current will cause the metal strip to be heated uniformly to a temperature causing a portion of the glass of the two parts of the holder adjacent to the metal strip to melt and adhere thereto. The two glass parts of the holder therefore will stick together and, when the source of heating current is removed, the glass will cool and harden to form a hermetic seal between the two parts of the holder. To prevent adverse effects on the crystal electrical performance due to undue heating produced in the metal supports connecting the electric leads to the semiconductor devices, the magnetic field is suitably shaped by shaping the induction coil to the geometry of the glass holder and contents thereof so that the magnetic field portions increase the heating of the metal strip and are out of phase with respect to the metal supports to reduce the heating thereof.

Various objects and features of the invention will be better understood from the following complete description thereof when it is read in conjunction with the several figures of the accompanying drawing, in which:

FIG. 1 shows a perspective view (not to scale) of one arrangement for sealing a quartz crystal device in a hollow glass holder, embodying the invention, partially broken away to show structural details more clearly; and FIGS. 2 to 5 show diagrammatically the various parts of the sealing arrangement of FIG. 1 and the configuration of magnetic fields produced by the induction coil arrangement surrounding the holder, used in connection with the description of the operation of the invention.

In FIG. 1, the hollow glass holder 1 comprises a solid base portion 2 having a groove 3 formed in its upper part around the perimeter thereof, and an upper hollow glass portion 4 fitting into the groove 3 of the base portion. A quartz crystal device 5 is mounted on the metal supports 6 affixed to base portion 2 and extending therethrough to form electric leads 7 on the exterior of the holder to be used for connecting the crystal device into the electrical circuit with which it is to be used. A closed metal strip 8 of Kovar material or other suitable alloy having a shape determined by the contour of the holder is imbedded in the upper surface of the groove 3 in the base portion 2 and extending around that groove. The alloy strip may be coated with a low melting point glaze having glass as its base, such as lead-borosilicate or other silicate flux powder mixed with a volatile substance such as alcohol or turpentine. A magnetic coil 9 having two turns which partially surround the holder in close proximity to the closed metal strip. The coil 9 is supplied with varying high frequency current from a suitable source, such as an RF oscillator, as indicated.

The varying high frequency current supplied from the RF oscillator flowing in the coil 9 generates a magnetic field around its turns which varies in magnitude and direction with that current. This will cause a heating current to be induced in the closed metal strip 8 which will melt the adjoining glass particles in the glass portions or the glass coating to form a frit between the adjoining surfaces of the two parts 2 and 4 of the glass holder causing them to stick together. When the source of varying current is removed from the coil 9 by any suitable means, this frit will cool and harden to produce a hermetic seal of the two glass holder parts around the mounted crystal device 5. However, since the crystal 5 is mounted within the glass holder 1 by metal supports 6, these supports ordinarily would be heated also to a sufficiently high temperature by the RF source to adversely affect the electrical performance of the crystal 5 supported by them. The particular arrangement of the coil whereby its magnetic field is shaped to eliminate or reduce to an appropriately low level the heating applied to the supports 6 so as not to appreciably affect the electrical performance of the crystal, while maintaining a sufficiently uniform heating of the closed metal strip 8 to aid in producing the vitreous seal of the holder parts, will be described in connection with FIGS. 2 to 5.

Figure 2:
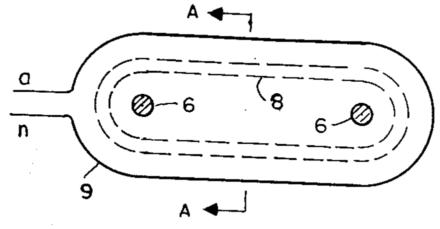
Figure 3:
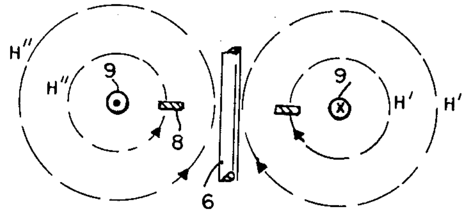

FIG. 2 shows the single turn of the coil 9 shaped to the geometry of the glass holder 1, which carries the varying current generated by the radio frequency oscillator, to be referred to hereinafter as the RF current. In FIG. 2, the dash lines represent the closed metal strip 8 of FIG. 1 and the cross-sections of the metal supports 6 for the quartz crystal 5 are shown therein in their relative location to that strip and the coil 9. FIG. 3 is a cross-sectional view taken along the line A—A of FIG. 2. The "X" and the dot on the shaded circles represent the instantaneous direction of RF current flow in the single turn of coil 9 into and out of the plane of the paper. The curved lines H'', H'' and H', H' represent the configuration and direction of the magnetic field produced by the single turn of coil 9 at a particular instant for the RF current shown. The inner lines H', H'' show that portion of the magnetic field which heats the closed metal strip 9, and the outer lines H', H'' that portion which is responsible for heating the metal supports 6. In the latter case, H' and H'' are in the same direction (in phase) and additive so that the same RF current which heats the closed metal strip 8 also heats the metal supports 6 to a high temperature which is not desirable. The arrangement described below in connection with FIG. 4 eliminates the additive feature of the magnetic field components at the supports 6 and produces out-of-phase components at these points thereby eliminating any appreciable heating effect on these supports while providing sufficient magnetic field to heat the metal strip 8 to the desired temperature to form the vitreous seal of the holder parts.

Figure 4:
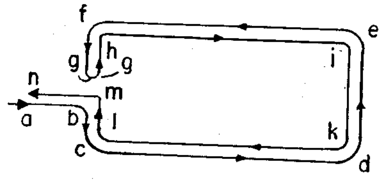

As shown in FIG. 4, the coil 9 consists of two turns (1) and (2) wound as shown. The arrows indicate the direction of current flow at a particular instant in the RF cycle. The first turn of the coil 9 represented in the figure by the single conductor labeled *a, b, c, d, e, f*, g is wound counterclockwise. At the point *g*, this conductor is bent back on itself and forms the second turn (2) labeled *g, h, i, k, l, m, n*, is wound beneath the first in the clockwise direction as shown. The terminals *a* and *n* lead to the oscillator supplying the varying RF current to the coil 9.

Figure 5:
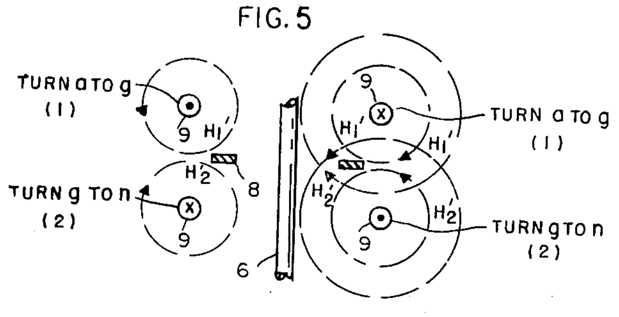

FIG. 5 shows the cross section of FIG. 4 with the holder parts and mountings inserted and labeled as in FIG. 1. In this figure, the H' and H'' lines represent the magnetic field due to each turn at the points of interest—the closed strip 8 and the supporting members 6. The X's and the dots on the shaded circles represent the instantaneous direction of RF current flow into and out of the plane of the paper. Referring to the right half of FIG. 5, the magnetic field components $H_1'$ and $H_2''$ of the turns (1) and (2) are in phase with each other and thus are additive producing heat in the metal strip 8. At the metal supports 6, the $H_1''$ and $H_2''$ of the two turns are out of phase with each other producing a reduction in the net magnetic field and hence less induced heating at these points. This is further reduced by similar consideration for the left half of the figure.

Thus, the configuration of the coil turns produces a lowering or elimination of heat-inducing magnetic fields along the central axis of the turns of the coil 9 which is desirable to prevent damage to the crystal device 5, and an intensification of heat-inducing magnetic fields inside and near the points where the imbedded metal strip 8 is located so as to enable sufficient heating thereof to produce a hermetic seal of the two glass parts of the holder.

Various modifications of the sealing arrangement, as described above and illustrated in the drawing, which are within the spirit and scope of the invention will occur to persons skilled in the art. For example, the device 5 may include a number of separate crystals connected in series with each other, and a greater number of turns of the induction coil 9 arranged to provide the in-phase relation of the magnetic field components at points adjacent to the closed metal strip 8 and an out-of-phase relation of the magnetic field components at the points where the metal supports 6 are located. Also, the holder may be evacuated or the air in the holder replaced with a suitable inert atmosphere, such as helium, nitrogen or other inert gas, by any of the well known methods either during or after the sealing operation.

What is claimed is:

1. In combination, a solid state electrical device, a hollow glass envelope including a solid glass base portion and hollow glass upper portion of inverted cup shape resting on said base portion, a pair of metal supports affixed to said base portion for fixedly mounting said device in said envelope and extending therethrough to form a pair of external electrical terminals connected to the terminals of the device and means for hermetically sealing the mounted device within said glass envelope comprising a closed metal strip imbedded in one of the adjoining surfaces of the glass portions of said envelope and making contact throughout its length with the adjoining surface of the other glass portion, an electromagnet having a plurality of turns partially surrounding said envelope in close proximity to the closed metal strip and means to apply for a short interval of time varying high frequency current to said electromagnet causing it to generate a varying magnetic field which induces a current in the closed metal strip of such value as to heat it to a desired temperature sufficient to melt some of the surrounding glass particles causing them to adhere to said strip, said glass particles on the removal of the high frequency current from said electromagnet at the end of said interval cooling and hardening to form a hermetic glass seal between the two portions of said envelope, and means for relatively arranging the turns of said electromagnet with respect to each other and for relatively positioning them with respect to said strip and said supports to shape the magnetic field produced by said electromagnet so that it is stronger near said closed metal strip increasing the heating current therein and is substantially weaker near said metal supports reducing the heating current therein to a negligible value thereby preventing deterioration in the electrical characteristics of said solid state device due to heat applied thereto from said supports during the sealing interval.

2. In combination with a solid state electrical device having terminals, an envelope including a solid glass base portion and a hollow glass upper portion of inverted-cup shape resting on the base portion, a pair of metal supports for fixedly mounting said device within said envelope, a pair of external electrical terminals extending through the walls of said envelope and connecting to the terminals of said solid state device and means for sealing the mounted solid state device within said envelope comprising a closed metal strip imbedded in one of the adjoining surfaces of the two portions of said envelope and making contact throughout its length with the other portion thereof, an electromagnet having a plurality of turns partially surrounding said envelope in close proximity to said strip and means for applying for a short interval of time varying high frequency current to said electromagnet causing it to generate a varying magnetic field which induces a current in said strip of such value as to melt some of the surrounding glass particles causing them to adhere to said strip, the glass particles on removal of the high frequency current from the electromagnet at the end of said interval cooling and hardening to form a hermetic glass seal between the two portions of said envelope, said electromagnet being made from a single conductor bent back on itself to form two turns in which the applied high frequency current flows in opposite directions so that the magnetic field components produced thereby are in phase with each other around the closed metal strip and serve to enhance the heating thereof and are out of phase with each other near the metal supports to reduce the heating thereof and thereby prevent damage to the semiconductor device tending to change its electrical characteristics due to heating.

References Cited in the file of this patent

UNITED STATES PATENTS 2,359,500 White ---------------- Oct. 3, 1944
2,568,460 Nolte ---------------- Sept. 18, 1951

FOREIGN PATENTS 118,453 Australia ---------------- Apr. 26, 1944